United States Patent
Shen et al.

(10) Patent No.: US 10,148,289 B2
(45) Date of Patent: Dec. 4, 2018

(54) POLAR CODE PROCESSING METHOD AND DEVICE

(71) Applicant: Huawei Technologies Co., Ltd., Shenzhen (CN)

(72) Inventors: Hui Shen, Shenzhen (CN); Bin Li, Shenzhen (CN); Jun Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 3 days.

(21) Appl. No.: 15/159,484

(22) Filed: May 19, 2016

(65) Prior Publication Data

US 2016/0269050 A1 Sep. 15, 2016

Related U.S. Application Data

(63) Continuation of application No. PCT/CN2013/087488, filed on Nov. 20, 2013.

(51) Int. Cl.
*H03M 13/00* (2006.01)
*H03M 13/27* (2006.01)
(Continued)

(52) U.S. Cl.
CPC ....... *H03M 13/2792* (2013.01); *H03M 13/13* (2013.01); *H03M 13/451* (2013.01); *H04L 1/0057* (2013.01); *H04L 1/0071* (2013.01)

(58) Field of Classification Search
CPC .. H03M 13/17; H03M 13/13; H03M 13/2792; H03M 13/451; H04L 1/0057; H04L 1/0071
(Continued)

(56) References Cited

U.S. PATENT DOCUMENTS 6,963,601 B1 11/2005 Kim et al.
9,628,114 B2 * 4/2017 Huang ................ H03M 13/616
(Continued)

FOREIGN PATENT DOCUMENTS

CN 102694625 A 9/2012
CN 103023618 A 4/2013
(Continued)

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, Issue 7, pp. 3051-3073, Institute of Electrical and Electronics Engineers, New York, New York (Jul. 2009).
(Continued)

*Primary Examiner* — Christine T. Tu
(74) *Attorney, Agent, or Firm* — Leydig, Voit & Mayer, Ltd.

(57) ABSTRACT

A method includes: dividing a first polar code into an odd number part and an even number part, where the odd number part of the first polar code includes bits in odd number locations in the first polar code, and the even number part of the first polar code includes bits in even number locations in the first polar code; and interleaving the odd number part of the first polar code to obtain a first bit sequence, and interleaving the even number part of the first polar code to obtain a second bit sequence, where the first bit sequence and the second bit sequence form an output sequence of rate matching.

20 Claims, 6 Drawing Sheets

(51) Int. Cl.
*H03M 13/13* (2006.01)
*H04L 1/00* (2006.01)
*H03M 13/45* (2006.01)

(58) Field of Classification Search
USPC ....... 714/752, 753, 755, 756, 758, 759, 800, 714/701, 702
See application file for complete search history.

(56) References Cited

U.S. PATENT DOCUMENTS

| | | |
|---|---|---|
| 2009/0147724 A1 | 6/2009 | Nimbalker et al. |
| 2011/0107019 A1 | 5/2011 | Pan et al. |
| 2013/0091407 A1 | 4/2013 | Cheng |
| 2013/0117344 A1 | 5/2013 | Gross et al. |
| 2013/0283116 A1 | 10/2013 | Arikan |
| 2013/0283128 A1 | 10/2013 | Lee et al. |
| 2015/0026543 A1 | 1/2015 | Li et al. |
| 2015/0143207 A1 | 5/2015 | Cheng |
| 2015/0333775 A1* | 11/2015 | Korb ............... H03M 13/45 714/780 |
| 2016/0380763 A1* | 12/2016 | Ahn ................. H04W 12/02 380/270 |
| 2017/0187501 A1 | 6/2017 | Atungsiri et al. |

FOREIGN PATENT DOCUMENTS

| | | |
|---|---|---|
| CN | 103368583 A | 10/2013 |
| KR | 20090045051 A | 5/2009 |
| KR | 20100029239 A | 3/2010 |
| RU | 2216858 C2 | 11/2003 |

OTHER PUBLICATIONS

Cadambe et al., "Interference Alignment and Spatial Degrees of Freedom for the $K$User Interference Channel," IEEE International Conference on Communications, Institute of Electrical and Electronics Engineers, New York, New York (May 19-23, 2008).

Tal et al., "List Decoding of Polar Codes," (May 31, 2012).

Mori et al., "Performance of Polar Codes with the Construction using Density Evolution," IEEE Communications Letters, vol. 13, Issue 7, pp. 519-521, Institute of Electrical and Electronics Engineers, New York, New York (Jul. 2009).

"LTE Convolutional Code Rate Matching—Update to R1-072969," 3GPP TSG RAN WG1 #49bis Meeting, Orlando, Florida, R1-073194, $3^{rd}$ Generation Partnership Project, Valbonne, France (Jun. 21-25, 2007).

* cited by examiner

POLAR CODE PROCESSING METHOD AND DEVICE

CROSS REFERENCE

This application is a continuation of International Patent Application No. PCT/CN2013/087488, filed on Nov. 20, 2013, which is hereby incorporated by reference in its entirety.

TECHNICAL FIELD

Embodiments of the present invention relate to the field of communications technologies, and in particular, to a polar code processing method and device.

BACKGROUND

In a communications system, data transmission reliability is usually improved by means of channel encoding, to ensure communication quality. A polar code (Polar code) is a linear block code, and it has been theoretically proved that the polar code is an encoding manner that can achieve a Shannon capacity and has low coding-decoding complexity. Encoding output of a polar code may be represented as follows:

$$x_1^N = u_1^N G_N,$$

where $u_1^N = \{u_1, u_2, \ldots, u_N\}$ is a binary row vector having a length of N; and $G_N$ is an N*N matrix, and $G_N = B_N F^{\otimes n}$, where a code length $N=2$, $n \geq 0$, $$F = \begin{bmatrix} 1 & 0 \\ 1 & 1 \end{bmatrix},$$

$B^N$ is a transposed matrix, and $F^{\otimes n}$ is a kronecker power (kronecker power), where it is defined that $F^{\otimes n} = F \otimes F^{\otimes (n-1)}$.

In an encoding process of a polar code, some bits in $u_1^N$ are used to carry information, where these bits are referred to as information bits, and it is assumed that a set of indices of these bits is A; and other bits are fixed values, referred to as frozen bits, and are usually set to 0. Therefore, encoding output of a polar code may be simplified into $x_1^N = u_A G_N(A)$, where $u_A$ is a set of the information bits in $u_1^N$, and $u_A$ is a row vector having a length of K, where K is a quantity of the information bits; $G_N(A)$ is a sub-matrix, in $G_N$, obtained according to rows corresponding to indices in the set A, and $G_N(A)$ is a K*N matrix; and performance of the polar code depends on selection of the set A.

To match a bearer capability of a physical channel and reach, during channel mapping, a bit rate required by a transport format, rate matching further needs to be performed on a polar code. In the prior art, a traditional HARQ (Hybrid Automatic Repeat Request) technology for random (quasi-random) puncturing is used for a polar code, that is, a puncturing location is randomly (quasi-randomly) selected. The prior art has a high frame error rate and poor HARQ performance.

SUMMARY

Embodiments of the present invention provide a polar code processing method and device, which can improve HARQ performance.

According to a first aspect, a polar code processing method is provided, where the method includes: dividing a first polar code into an odd number part and an even number part, where the odd number part of the first polar code includes bits in odd number locations in the first polar code, and the even number part of the first polar code includes bits in even number locations in the first polar code; and interleaving the odd number part of the first polar code to obtain a first bit sequence, and interleaving the even number part of the first polar code to obtain a second bit sequence, where the first bit sequence and the second bit sequence form an output sequence of rate matching.

With reference to the first aspect, in another implementation manner of the first aspect, the first polar code has a length of N and a bit rate of R, where R>0, $N=2^n$, and n is an integer that is greater than or equal to 0; and a set of information bits of the first polar code is obtained according to a set of information bits of a second polar code that has a length of N/2 and a bit rate of 2R; and before the dividing a first polar code into an odd number part and an even number part, the method further includes: determining locations of the information bits in the first polar code according to locations of the information bits in the second polar code.

With reference to the first aspect and any implementation manner of the foregoing implementation manner of the first aspect, in another implementation manner of the first aspect, the determining locations of the information bits in the first polar code according to locations of the information bits in the second polar code includes: determining that the locations of the information bits in the second polar code plus N/2 are the locations of the information bits in the first polar code.

With reference to the first aspect and any implementation manner of the foregoing implementation manners of the first aspect, in another implementation manner of the first aspect, sequence numbers in the first polar code that are less than or equal to N/2 include sequence numbers oft information bits, and the determining locations of the information bits in the first polar code according to locations of the information bits in the second polar code includes: determining that a location of the $(K-t)^{th}$ information bit in the second polar code plus N/2 is locations of information bits in the first polar code that have sequence numbers greater than N/2, where K is a positive integer and K=N*R, and t is a positive integer and $0 \leq t < K$.

With reference to the first aspect and any implementation manner of the foregoing implementation manners of the first aspect, in another implementation manner of the first aspect, the interleaving the odd number part of the first polar code to obtain a first bit sequence, and interleaving the even number part of the first polar code to obtain a second bit sequence includes: performing pseudo-random interleaving on the odd number part of the first polar code to obtain the first bit sequence, and performing pseudo-random interleaving on the even number part of the first polar code to obtain the second bit sequence; or performing quadratic Quadratic interleaving on the odd number part of the first polar code to obtain the first bit sequence, and performing quadratic interleaving on the even number part of the first polar code to obtain the second bit sequence.

With reference to the first aspect and any implementation manner of the foregoing implementation manners of the first aspect, in another implementation manner of the first aspect, the quadratic interleaving is defined as follows:

$$c(m) = \frac{km(m+1)}{2} (\mathrm{mod} N),$$

and a mapping function is c(m) a c(m+1)(mod N), where m is a positive integer and 0≤m<N, k is an odd number, and mod indicates a modulo operation.

With reference to the first aspect and any implementation manner of the foregoing implementation manners of the first aspect, in another implementation manner of the first aspect, the first bit sequence is the front half of the output sequence of rate matching, and the second bit sequence is the rear half of the output sequence of rate matching; or the second bit sequence is the front half of the output sequence of rate matching, and the first bit sequence is the rear half of the output sequence of rate matching.

According to a second aspect, a polar code processing device is provided, where the device includes: a division unit, configured to divide a first polar code into an odd number part and an even number part, where the odd number part of the first polar code includes bits in odd number locations in the first polar code, and the even number part of the first polar code includes bits in even number locations in the first polar code; and an interleaving unit, configured to interleave the odd number part of the first polar code that is obtained through division by the division unit, to obtain a first bit sequence, and interleave the even number part of the first polar code that is obtained through division by the division unit, to obtain a second bit sequence, where the first bit sequence and the second bit sequence form an output sequence of rate matching.

With reference to the second aspect, in another implementation manner of the second aspect, the first polar code has a length of N and a bit rate of R, where R>0, N=$2^n$, and n is an integer that is greater than or equal to 0; and a set of information bits of the first polar code is obtained according to a set of information bits of a second polar code that has a length of N/2 and a bit rate of 2R; and the device further includes a determining unit, where the determining unit is configured to determine locations of the information bits in the first polar code according to locations of the information bits in the second polar code.

With reference to the second aspect and any implementation manner of the foregoing implementation manner of the second aspect, in another implementation manner of the second aspect, the determining unit is specifically configured to determine that the locations of the information bits in the second polar code plus N/2 are the locations of the information bits in the first polar code.

With reference to the second aspect and any implementation manner of the foregoing implementation manners of the second aspect, in another implementation manner of the second aspect, sequence numbers in the first polar code that are less than or equal to N/2 include sequence numbers of t information bits, and the determining unit is specifically configured to determine that a location of the $(K-t)^{th}$ information bit in the second polar code plus N/2 is locations of information bits in the first polar code that have sequence numbers greater than N/2, where K is a positive integer and K=N*R, and t is a positive integer and 0≤t<K.

With reference to the second aspect and any implementation manner of the foregoing implementation manners of the second aspect, in another implementation manner of the second aspect, the interleaving unit is specifically configured to perform pseudo-random interleaving on the odd number part of the first polar code to obtain the first bit sequence, and perform pseudo-random interleaving on the even number part of the first polar code to obtain the second bit sequence; or the interleaving unit is specifically configured to perform quadratic Quadratic interleaving on the odd number part of the first polar code to obtain the first bit sequence, and perform quadratic interleaving on the even number part of the first polar code to obtain the second bit sequence.

With reference to the second aspect and any implementation manner of the foregoing implementation manners of the second aspect, in another implementation manner of the second aspect, the quadratic interleaving is defined as follows:

$$c(m) = \frac{km(m+1)}{2}(\mathrm{mod}N),$$

and a mapping function is c(m) a c(m+1)(mod N), where m is a positive integer and 0≤m<N, k is an odd number, and mod indicates a modulo operation.

With reference to the second aspect and any implementation manner of the foregoing implementation manners of the second aspect, in another implementation manner of the second aspect, the first bit sequence obtained by the interleaving unit is the front half of the output sequence of rate matching, and the second bit sequence is the rear half of the output sequence of rate matching; or the second bit sequence obtained by the interleaving unit is the front half of the output sequence of rate matching, and the first bit sequence is the rear half of the output sequence of rate matching.

According to a third aspect, a wireless communications apparatus is provided, where the wireless communications apparatus includes: a memory, configured to save an instruction for performing the following operations: dividing a first polar code into an odd number part and an even number part, where the odd number part of the first polar code includes bits in odd number locations in the first polar code, and the even number part of the first polar code includes bits in even number locations in the first polar code; and interleaving the odd number part of the first polar code to obtain a first bit sequence, and interleaving the even number part of the first polar code to obtain a second bit sequence, where the first bit sequence and the second bit sequence form an output sequence of rate matching; and a processor, coupled to the memory, and configured to execute an instruction saved in the memory.

With reference to the third aspect, in another implementation manner of the third aspect, the first polar code has a length of N and a bit rate of R, where R>0, N=$2^n$, and n is an integer that is greater than or equal to 0; and a set of information bits of the first polar code is obtained according to a set of information bits of a second polar code that has a length of N/2 and a bit rate of 2R; and the memory is further configured to save an instruction for performing the following operation: determining locations of the information bits in the first polar code according to locations of the information bits in the second polar code.

With reference to the third aspect and any implementation manner of the foregoing implementation manner of the third aspect, in another implementation manner of the third aspect, the memory is specifically configured to save an instruction for performing the following operation: determining that the locations of the information bits in the second polar code plus N/2 are the locations of the information bits in the first polar code.

With reference to the third aspect and any implementation manner of the foregoing implementation manners of the third aspect, in another implementation manner of the third aspect, sequence numbers in the first polar code that are less than or equal to N/2 include sequence numbers oft information bits, and the memory is specifically configured to save an instruction for performing the following operation: determining that locations of (K−t) information bits in the second polar code plus N/2 are locations of information bits in the first polar code that have sequence numbers greater than N/2, where K is a positive integer and K=N*R, and t is a positive integer and 0≤t<K.

With reference to the third aspect and any implementation manner of the foregoing implementation manners of the third aspect, in another implementation manner of the third aspect, the memory is specifically configured to save an instruction for performing the following operation: performing pseudo-random interleaving on the odd number part of the first polar code to obtain the first bit sequence, and performing pseudo-random interleaving on the even number part of the first polar code to obtain the second bit sequence; or performing quadratic Quadratic interleaving on the odd number part of the first polar code to obtain the first bit sequence, and performing quadratic interleaving on the even number part of the first polar code to obtain the second bit sequence.

With reference to the third aspect and any implementation manner of the foregoing implementation manners of the third aspect, in another implementation manner of the third aspect, the memory is specifically configured to save an instruction for performing the following operation: the first bit sequence is the front half of the output sequence of rate matching, and the second bit sequence is the rear half of the output sequence of rate matching; or the second bit sequence is the front half of the output sequence of rate matching, and the first bit sequence is the rear half of the output sequence of rate matching.

In the embodiments of the present invention, a first polar code is divided into an odd number part and an even number part, where the odd number part of the first polar code includes bits in odd number locations in the first polar code, and the even number part of the first polar code includes bits in even number locations in the first polar code; and the odd number part of the first polar code is interleaved to obtain a first bit sequence, and the even number part of the first polar code is interleaved to obtain a second bit sequence, where the first bit sequence and the second bit sequence form an output sequence of rate matching. In the embodiments of the present invention, the first polar code is divided according to odd number locations and even number locations, and interleaving is separately performed to form the output sequence of rate matching. In this way, a sequence structure after interleaving is more random, and an FER (Frame Error Rate, frame error rate) can be reduced. By reducing the frame error rate, HARQ performance can be improved, and data transmission reliability can be ensured.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
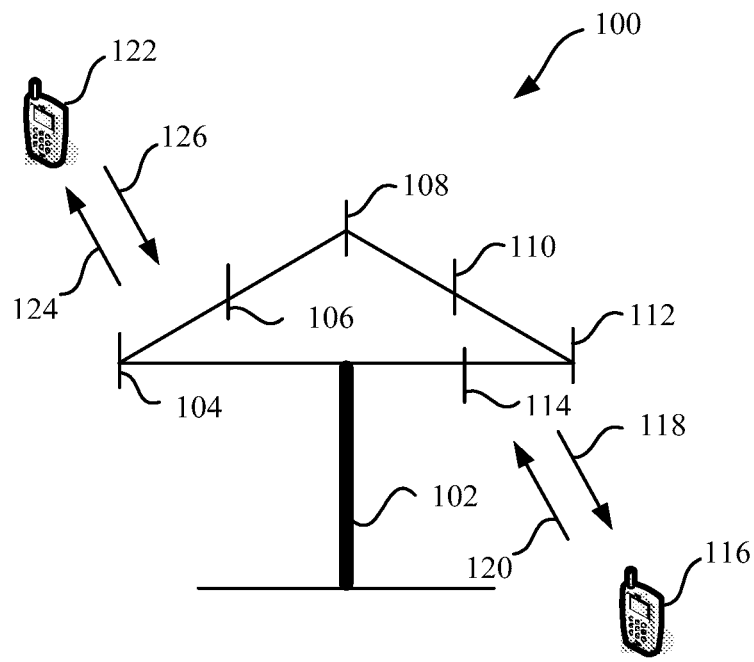
FIG. 1 is a schematic diagram of a wireless communications system according to embodiments of this application.

Multiple embodiments are described with reference to the accompanying drawings, and same components in this specification are indicated by a same reference numeral. In the following description, for ease of explanation, many specific details are provided to facilitate comprehensive understanding of one or more embodiments. However, apparently, the embodiments may also not be implemented by using these specific details. In other examples, a well-known structure and device are shown in a form of block diagrams, to conveniently describe one or more embodiments.

Terms such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store data structures. For example, the components may communicate by using a local and/or a remote process and according to, for example, a signal having one or more data packets (for example, data from two components interacting with another component in a local system, a distributed system, and/or across a network such as the Internet interacting with other systems by using the signal).

In addition, the embodiments are described with reference to an access terminal. An access terminal may also be referred to as a system, a subscriber unit, a subscriber station, a mobile station, a mobile, a remote station, a remote terminal, a mobile device, a user terminal, a terminal, a wireless communications device, user agent, a user apparatus, or UE (User Equipment, user equipment). The access terminal may be a cellular phone, a cordless phone, a SIP (Session Initiation Protocol, Session Initiation Protocol) phone, a WLL (Wireless Local Loop, wireless local loop) station, a PDA (Personal Digital Assistant, personal digital assistant), a handheld device having a wireless communication function, a computing device, or another processing device connected to a wireless modem. In addition, the embodiments are described with reference to a base station. A base station can be used to communicate with a mobile device; and the base station may be a BTS (Base Transceiver Station, base transceiver station) in GSM (Global System for Mobile Communications) or CDMA (Code Division Multiple Access); or may be an NB (NodeB) in WCDMA (Wideband Code Division Multiple Access); or may be an eNB or eNodeB (Evolutional Node B, evolved NodeB) in LTE (Long Term Evolution), a relay station or an access point, a base station device in a future 5G network, or the like.

In addition, aspects or features of the present invention may be implemented as a method, an apparatus or a product that uses standard programming and/or engineering technologies. The term "product" used in this application covers a computer program that can be accessed from any computer-readable component, carrier or medium. For example, the computer-readable medium may include but is not limited to: a magnetic storage component (for example, a hard disk, a floppy disk or a magnetic tape), an optical disc (for example, a CD (Compact Disk), a DVD (Digital Versatile Disk), a smart card and a flash memory component (for example, EPROM (Erasable Programmable Read-Only Memory), a card, a stick, or a key drive). In addition, various storage media described in this specification may indicate one or more devices and/or other machine-readable media that is used to store information. The term "machine-readable media" may include but is not limited to a wireless channel, and various other media that can store, contain and/or carry an instruction and/or data.

Referring to FIG. 1, FIG. 1 shows a wireless communications system 100 according to the embodiments of this specification. The system 100 includes a base station 102, which may include multiple antenna groups. For example, an antenna group may include an antenna 104 and an antenna 106, another antenna group may include an antenna 108 and an antenna 110, and an additional group may include an antenna 112 and an antenna 114. For each antenna group, two antennas are shown; however, more or less antennas may be used for each group. The base station 102 may additionally include a transmitter chain and a receiver chain, and a person of ordinary skill in the art may understand that both the transmitter link and the receiver link may include multiple components related to signal sending and receiving (for example, a processor, a modulator, a multiplexer, a demodulator, a demultiplexer, and an antenna).

The base station 102 may communicate with one or more access terminals (for example, an access terminal 116 and an access terminal 122). However, it may be understood that the base station 102 may basically communicate with any quantity of access terminals similar to the access terminal 116 and the access terminal 122. The access terminal 116 and the access terminal 122 may be, for example, a cellular phone, a smart phone, a portable computer, a handheld communications device, a handheld computing device, a satellite radio apparatus, a global positioning system, a PDA, and/or any other suitable devices configured to perform communication in the wireless communications system 100. As shown in the figure, the access terminal 116 communicates with the antenna 112 and the antenna 114, and the antenna 112 and the antenna 114 send information to the access terminal 116 by using a forward link 118, and receive information from the access terminal 116 by using a reverse link 120. Besides, the access terminal 122 communicates with the antenna 104 and the antenna 106, and the antenna 104 and the antenna 106 send information to the access terminal 122 by using a forward link 124, and receive information from the access terminal 122 by using a reverse link 126. In an FDD (Frequency Division Duplex) system, for example, the forward link 118 may use a frequency band different from that used by the reverse link 120, and the forward link 124 may use a frequency band different from that used by the reverse link 126. In addition, in a TDD (Time Division Duplex, time division duplex) system, the forward link 118 and the reverse link 120 may use a common frequency band, and the forward link 124 and the reverse link 126 may use a common frequency band.

Each antenna group and/or area designed for communication is referred to as a sector of the base station 102. For example, an antenna group may be designed to communicate with an access terminal in a sector of a coverage area of the base station 102. During communication by using the forward link 118 and the forward link 124, a transmit antenna of the base station 102 may improve, by means of beamforming, signal to noise ratios of the forward link 118 and the forward link 124 respectively for the access terminal 116 and the access terminal 122. In addition, compared with sending, by the base station by using a single antenna, information to all access terminals of the base station, sending, by the base station 102 by means of beamforming, information to the access terminal 116 and the access terminal 122 that are scattered randomly in a related coverage area causes less interference to a mobile device in a neighboring cell.

In a given time period, the base station 102, the access terminal 116, and/or the access terminal 122 may be a sending wireless communications apparatus and/or a receiving wireless communications apparatus. When sending data, the sending wireless communications apparatus may encode the data for transmission. Specifically, the sending wireless communications apparatus may have (for example, generate, obtain, save in a memory) a quantity of information bits to be sent to the receiving wireless communications apparatus on a channel. The information bits may be included in a transport block (or multiple transport blocks) of data, and the transport block may be segmented to generate multiple code blocks. In addition, the sending wireless communications apparatus may encode each code block by using a polar code encoder (which is not shown).

Figure 2:
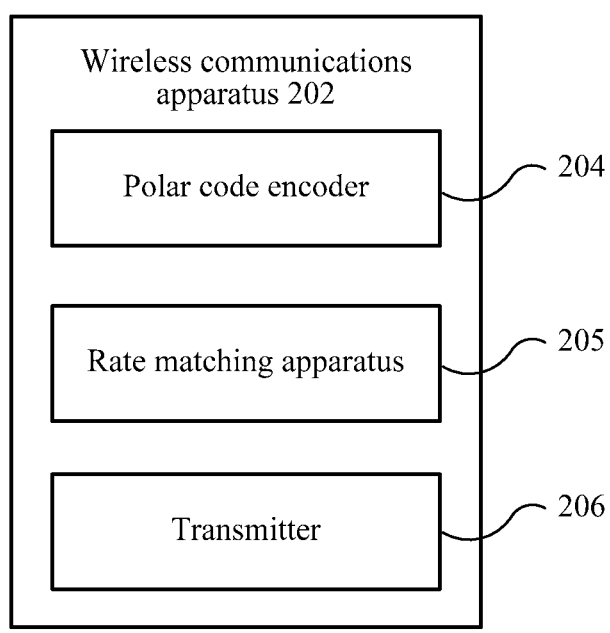
FIG. 2 is a schematic diagram of a system for executing a polar code processing method of an implementation manner of the present invention in a wireless communications environment.

Proceed to FIG. 2, FIG. 2 shows a system 200 for executing a polar code processing method in a wireless communications environment. The system 200 includes a wireless communications apparatus 202, where it is displayed that the wireless communications apparatus 202 sends data on a channel. Although it is shown that the wireless communications apparatus 202 sends data, the wireless communications apparatus 202 may also receive data on a channel (for example, the wireless communications apparatus 202 may simultaneously send and receive data, the wireless communications apparatus 202 may send and receive data at different time points, or the two cases coexist). The wireless communications apparatus 202 may be, for example, a base station (for example, the base station 102 in FIG. 1), an access terminal (for example, the access terminal 116 in FIG. 1 or the access terminal 122 in FIG. 1), or the like.

The wireless communications apparatus 202 may include a polar code encoder 204, a rate matching apparatus 205, and a transmitter 206.

The polar code encoder 204 is configured to encode data to be transmitted from the wireless communications apparatus 202.

The rate matching apparatus 205 is configured to divide a first polar code output by the polar code encoder 204 into an odd number part and an even number part, where the odd number part of the first polar code includes bits in odd number locations in the first polar code, and the even number part of the first polar code includes bits in even number locations in the first polar code; and interleave the odd number part of the first polar code to obtain a first bit sequence, and interleave the even number part of the first polar code to obtain a second bit sequence, where the first bit sequence and the second bit sequence form an output sequence of rate matching.

In addition, the transmitter 206 may subsequently transmit, on a channel, the output sequence that has been processed by the rate matching apparatus 205 and on which rate matching has been performed. For example, the transmitter 206 may send related data to other different wireless communications apparatuses (which are not shown).

Figure 3:
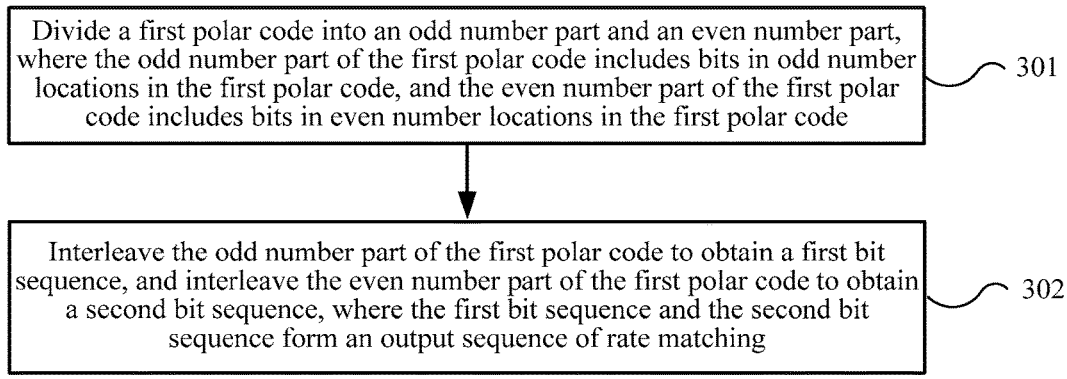
FIG. 3 is a flowchart of a polar code processing method according to an embodiment of the present invention.

FIG. 3 is a flowchart of a polar code processing method according to an embodiment of the present invention. The method in FIG. 3 may be executed by a rate matching device (such as an interleaver) in a polar code processing device.

301: Divide a first polar code into an odd number part and an even number part, where the odd number part of the first polar code includes bits in odd number locations in the first polar code, and the even number part of the first polar code includes bits in even number locations in the first polar code.

302: Interleave the odd number part of the first polar code to obtain a first bit sequence, and interleave the even number part of the first polar code to obtain a second bit sequence, where the first bit sequence and the second bit sequence form an output sequence of rate matching.

By using the foregoing solution, the first polar code is divided into the odd number part and the even number part, which are separately interleaved to form the output sequence of rate matching. In this way, a sequence structure after interleaving is more random, and correlation between sequences before and after interleaving is reduced. Therefore, an FER (Frame Error Rate) can be reduced. By reducing the FER, HARQ performance is improved, and data transmission reliability is ensured.

The foregoing implementation manner and specific example are merely exemplary. It should be understood that locations of information bits in the first polar code are not limited in this embodiment of the present invention. Preferably, the information bits may be arranged in the rear half of a bit sequence of the first polar code with reference to the following solutions.

Figure 4:
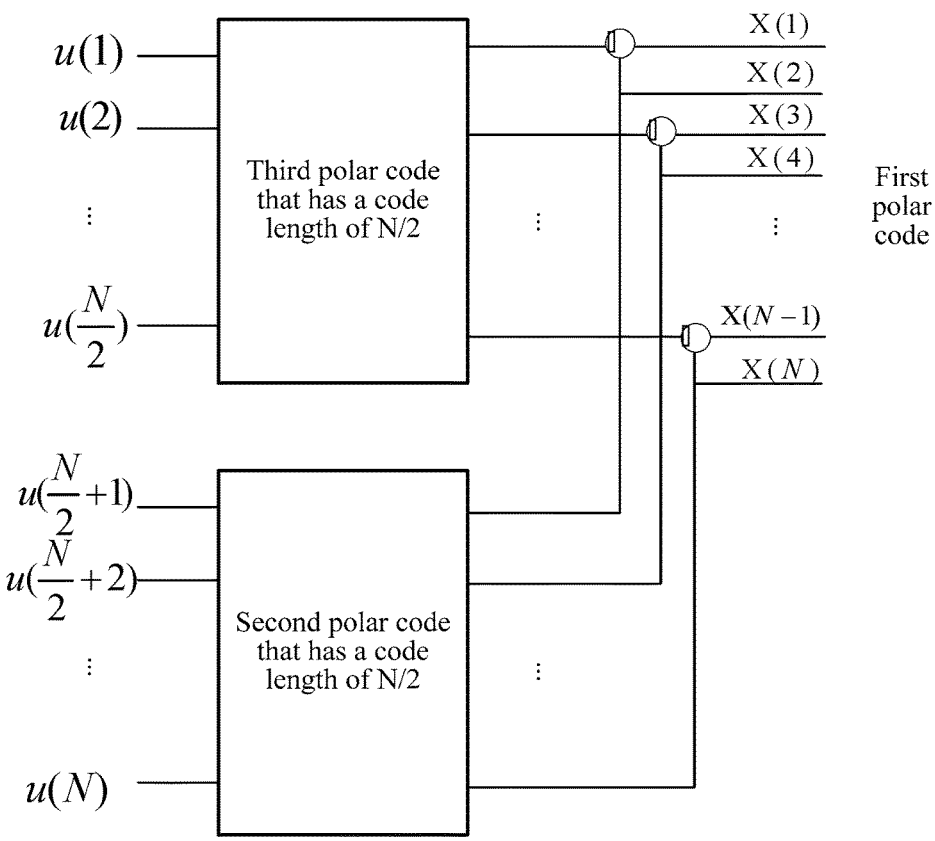
FIG. 4 is a schematic diagram of a recursive structure of a polar code according to an embodiment of the present invention.

The first polar code has a length of N and a bit rate of R, where R>0, N=$2^n$, n is an integer, and n≥0. A polar code has a recursive structure, and it may be considered that the first polar code is obtained according to two polar codes (which are a second polar code and a third polar code) that have code lengths of N/2. As may be schematically shown in FIG. 4, the first polar code is $X^N$, where $X^N=\{X(1), X(2), \ldots, X(N)\}$; and the two polar codes are a third polar code $X_1^{N/2}$ and a second polar code $X_2^{N/2}$, where $X_1^{N/2}=u_1^{N/2}G_{1N}=\{X_1(1), X_1(2), \ldots, X_1(N/2)\}$, and $X_2^{N/2}=u_2^{N/2}G_{2N}=\{X_2(1),$ $X_2(2), \ldots, X_2(N/2)\}$, where both $G_{1N}$ and $G_{2N}$ and are generator matrices, and both $$u_1^{N/2} = \left\{u(1), u(2), \ldots, u\left(\frac{N}{2}\right)\right\} \text{ and } u_2^{N/2} = \left\{u\left(\frac{N}{2}+1\right), u\left(\frac{N}{2}+2\right), \ldots, u(N)\right\}$$

are binary row vectors that have lengths of N/2.

Specifically, before step 301, the method may further include: determining the locations of the information bits in the first polar code according to locations of information bits in a polar code that has a code length of N/2 (for example, the foregoing second polar code), which is a selection process of a mother code and may be performed by a polar code encoder in the polar code processing device. Determining of other locations in the first polar code is not limited herein.

Optionally, in a possible implementation manner, it may be determined that the locations of the information bits in the second polar code plus N/2 are the locations of the information bits in the first polar code. For example, assuming that N=32, that is, the length of the first polar code is 32 and the length of the second polar code is 16, and assuming that a location of an information bit in the second polar code is the sixth location in a bit sequence of the second polar code, it is determined that the $22^{nd}$ location in a bit sequence of the first polar code is a location of the information bit.

Optionally, in another possible implementation manner, sequence numbers in the first polar code that are less than or equal to N/2 include sequence numbers of t information bits, and the determining the locations of the information bits in the first polar code according to locations of information bits in the second polar code may specifically include: determining that locations of (K−t) information bits in the second polar code plus N/2 are separately locations of information bits in the first polar code that have sequence numbers greater than N/2, where K is a positive integer and K=N*R, where optionally, R≤½, and t is a positive integer and 0≤t<K.

For example, N=32, t=2, R=¼, K=N*R=8, and a bit sequence that has a length less than 16 in the first polar code has two information bits; optionally, it is determined that locations of a total of 8−2=6 information bits in the second polar code separately plus 32/2=16 are locations of information bits in the first polar code.

By using the foregoing solutions, the information bits in the first polar code are arranged in the rear half of the bit sequence of the first polar code. In this way, based on some rules for polar code construction, a frame error rate can be further reduced, and HARQ performance of a polar code can be further improved.

Optionally, in another embodiment, in step 302, pseudo-random interleaving may be performed on the odd number part of the first polar code to obtain the first bit sequence, and pseudo-random interleaving may be performed on the even number part of the first polar code to obtain the second bit sequence. Alternatively, quadratic interleaving may be performed on the odd number part of the first polar code to obtain the first bit sequence, and quadratic interleaving may be performed on the even number part of the first polar code to obtain the second bit sequence.

Specifically, quadratic interleaving is defined as follows:

$$c(m) = \frac{km(m+1)}{2} (\bmod N), \quad (1)$$

and
a mapping function is:

$$C(M) a\ c(m+1)(\bmod N) \quad (2),\text{ where}$$

m is a positive integer and 0≤m<N, k is an odd number, and mod indicates a modulo operation.

It should be understood that an interleaving manner is not limited in this embodiment of the present invention, and may be pseudo-random interleaving or Quadratic interleaving, or may be another interleaving manner.

Optionally, in another embodiment, the forming, by the first bit sequence and the second bit sequence, an output sequence of rate matching may specifically include cases as follows: the first bit sequence is the front half of the output sequence of rate matching, and the second bit sequence is the rear half of the output sequence of rate matching; or the second bit sequence is the front half of the output sequence of rate matching, and the first bit sequence is the rear half of the output sequence of rate matching.

An embodiment of the present invention is described below with reference to FIG. 5.

Figure 5:
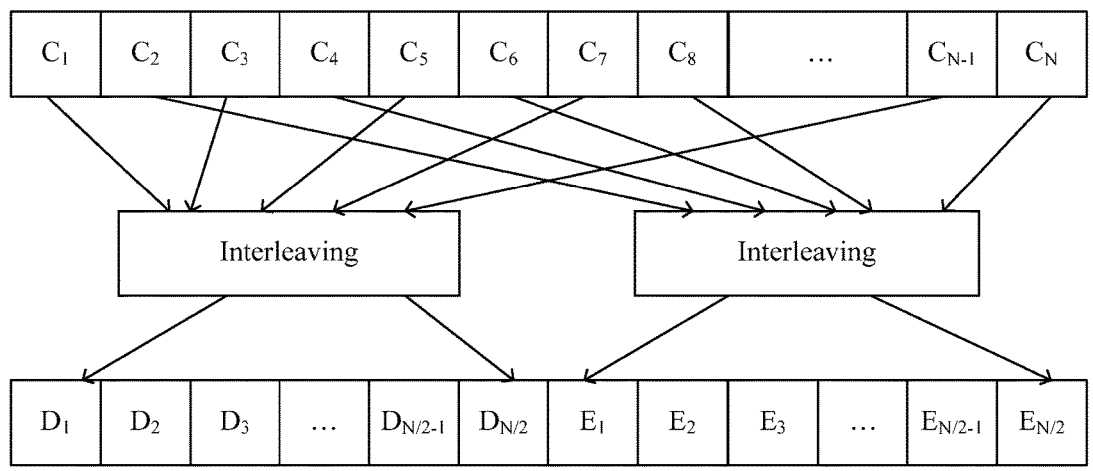
FIG. 5 is a schematic diagram of a rate matching method of a polar code according to an embodiment of the present invention.

As shown in FIG. 5, a bit sequence of a first polar code is $C_1C_2C_3C_4C_5C_6C_7C_8 \ldots C_{N-1}C_N$. Preferably, information bits in the first polar code are in the rear half of the bit sequence of the first polar code. Specifically, for an embodiment about how to determine locations of the information bits in the first polar code, refer to the foregoing description, and a detailed description is not provided herein again.

Step 501: Divide the first polar code into an odd number part and an even number part, where the odd number part of the first polar code is $C_1C_3C_5C_7 \ldots C_{N-1}$, and the even number part of the first polar code is $C_2 C_4 C_6 C_8 \ldots C_N$.

Step 502: Interleave the odd number part $C_1C_3C_5C_7 \ldots C_{N-1}$ of the first polar code to obtain a first bit sequence $D_1D_2D_3 \ldots D_{N/2-1}D_{N/2}$, and interleave the even number part of the first polar code to obtain a second bit sequence $E_1E_2E_3 \ldots E_{N/2-1}E_{N/2}$.

Optionally, pseudo-random interleaving or quadratic interleaving may be used as an interleaving manner, or other interleaving manners may be used, which is not limited in this embodiment of the present invention.

Optionally, an output sequence of rate matching that includes the first bit sequence and the second bit sequence may be $D_1D_2D_3 \ldots D_{N/2-1}D_{N/2}E_1E_2E_3 \ldots E_{N/2-1}E_{N/2}$, or an output sequence of rate matching that includes the first bit sequence and the second bit sequence may be $E_1E_2E_3 \ldots E_{N/2-1}E_{N/2}D_1D_2D_3 \ldots D_{N/2-1}D_{N/2}$. It should be understood that this is not limited in this embodiment of the present invention.

In this embodiment of the present invention, a first polar code is divided into an odd number part and an even number part, which are separately interleaved to form an output sequence of rate matching. In this way, a sequence structure after interleaving is more random. Therefore, a frame error rate can be reduced, HARQ performance of a polar code can be improved, and data transmission reliability can be ensured.

Figure 6:
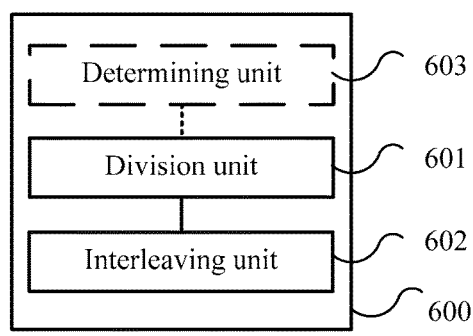
FIG. 6 is a structural block diagram of a polar code processing device according to an embodiment of the present invention.

FIG. 6 is a structural block diagram of a polar code processing device according to an embodiment of the present invention. The polar code processing device 600 in FIG. 6 includes a division unit 601 and an interleaving unit 602.

The polar code processing device includes a rate matching device (for example, an interleaver), and functions of the division unit 601 and the interleaving unit 602 may be implemented by using an interleaver.

The division unit 601 is configured to divide a first polar code into an odd number part and an even number part, where the odd number part of the first polar code includes bits in odd number locations in the first polar code, and the even number part of the first polar code includes bits in even number locations in the first polar code.

The interleaving unit 602 is configured to interleave the odd number part of the first polar code that is obtained by using division by the division unit 601, to obtain a first bit sequence, and interleave the even number part of the first polar code that is obtained by using division by the division unit 601, to obtain a second bit sequence, where the first bit sequence and the second bit sequence form an output sequence of rate matching.

The polar code processing device 600 can implement the steps and operations involved in the embodiments in FIG. 1 to FIG. 3, and a detailed description is not provided again to avoid repetition.

The first polar code has a length of N and a bit rate of R, where R>0, N=$2^n$, n is an integer, and n≥0. A polar code has a recursive structure, and it may be considered that the first polar code is obtained according to two polar codes (which are a second polar code and a third polar code) that have code lengths of N/2, which may be schematically shown in FIG. 2 and is not described in detail herein again. Correspondingly, a set of information bits of the first polar code is obtained according to a set of information bits of a second polar code that has a length of N/2 and a bit rate of 2R.

Optionally, in an embodiment, locations of the information bits in the first polar code are in the rear half of a bit sequence of the first polar code. Specifically, a rate matching device 600 of a polar code further includes a determining unit 603, where the determining unit 603 is configured to determine the locations of the information bits in the first polar code according to locations of the information bits in the second polar code, and a function of the determining unit 603 may be implemented by a polar code encoder.

Optionally, the determining unit 603 may be specifically configured to determine that the locations of the information bits in the second polar code plus N/2 are the locations of the information bits in the first polar code.

Optionally, sequence numbers in the first polar code that are less than or equal to N/2 include sequence numbers of t information bits, and the determining unit 603 may also be specifically configured to determine that a location of the $(K-t)^{th}$ information bit in the second polar code plus N/2 is locations of information bits in the first polar code that have sequence numbers greater than N/2, where K is a positive integer and K=N*R, where optionally, R≤½, and t is a positive integer and 0≤t<K.

For a specific example, refer to the foregoing description, and a detailed description is not provided herein again. It should be understood that the locations of the information bits in the first polar code are not limited in this embodiment of the present invention, and are preferably arranged in the rear half of the bit sequence of the first polar code.

By using the foregoing solutions, the information bits in the first polar code are arranged in the rear half of the bit sequence of the first polar code. In this way, a frame error rate can be reduced, and HARQ performance of a polar code can be improved.

Optionally, in another embodiment, the interleaving unit 602 may be specifically configured to perform pseudo-random interleaving on the odd number part of the first polar code to obtain the first bit sequence, and perform pseudo-random interleaving on the even number part of the first polar code to obtain the second bit sequence; or the interleaving unit 602 may be specifically configured to perform Quadratic interleaving on the odd number part of the first polar code to obtain the first bit sequence, and perform quadratic interleaving on the even number part of the first polar code to obtain the second bit sequence.

Specifically, the quadratic interleaving is defined as follows:

$$c(m) = \frac{km(m+1)}{2}(\mathrm{mod}N),$$

and a mapping function is c(m)a c(m+1)(mod N), where m is a positive integer and 0≤m<N, k is an odd number, and mod indicates a modulo operation.

Optionally, in another embodiment, the first bit sequence obtained by the interleaving unit 602 may be the front half of the output sequence of rate matching, and the second bit sequence may be the rear half of the output sequence of rate matching; certainly, the second bit sequence obtained by the interleaving unit 602 may be the front half of the output sequence of rate matching, and the first bit sequence may be the rear half of the output sequence of rate matching. It should be understood that this is not limited in this embodiment of the present invention.

Figure 7:
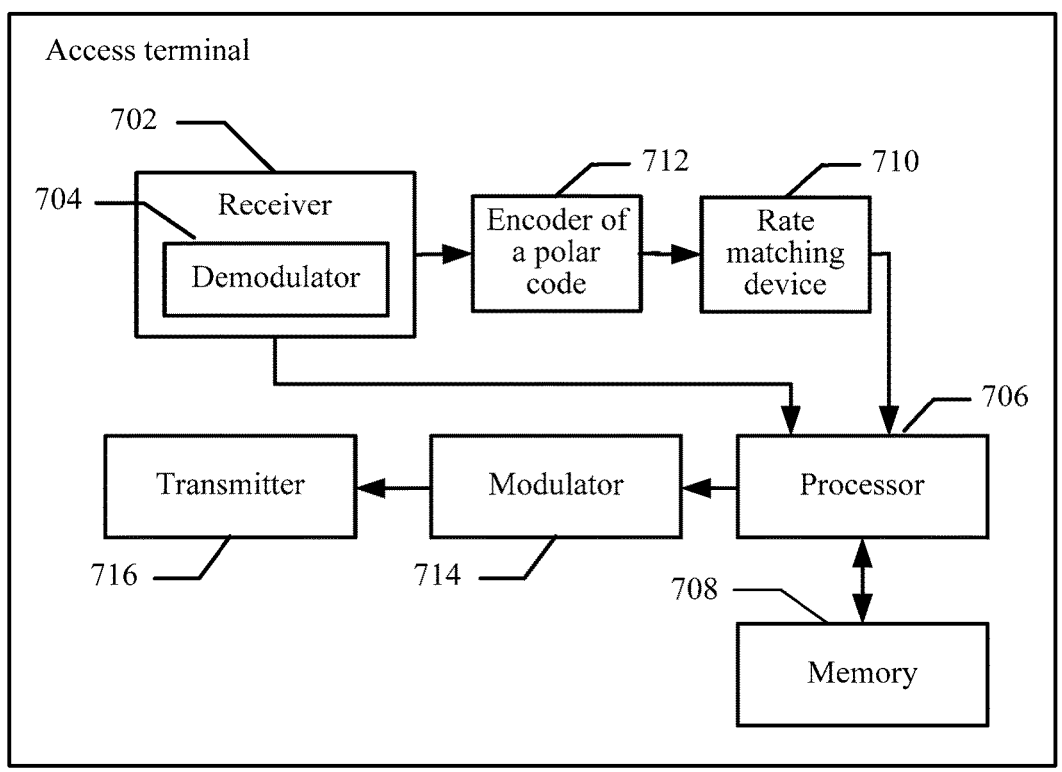
FIG. 7 is a schematic diagram of an exemplary access terminal that facilitates execution of the foregoing polar code processing method in a wireless communications system.

FIG. 7 is a schematic diagram of an access terminal 700 that facilitates execution of the foregoing polar code processing method in a wireless communications system. The access terminal 700 includes a receiver 702, where the receiver 702 is configured to receive a signal from, for example, a receive antenna (which is not shown), perform a typical operation (for example, filtering, amplification, or down-conversion) on the received signal, and digitize the adjusted signal to obtain a sample. The receiver 702 may be, for example, an MMSE (Minimum Mean-Squared Error) receiver. The access terminal 700 may further include a demodulator 704, where the demodulator 704 may be configured to demodulate the received signals and provide the signals to a processor 706 for channel estimation. The processor 706 may be a processor dedicated to analyzing information received by the receiver 702 and/or generating information to be sent by a transmitter 716, a processor configured to control one or more components of the access terminal 700, and/or a controller configured to analyze information received by the receiver 702, generate information to be sent by a transmitter 716, and control one or more components of the access terminal 700.

The access terminal 700 may additionally include a memory 708, where the memory 708 is operationally coupled to the processor 706, and stores the following data: data to be sent, received data, and any other suitable information related to execution of various operations and functions in this specification. The memory 708 may additionally store a protocol and/or an algorithm related to polar code processing.

It may be understood that a data storage apparatus (for example, the memory 708) described in this specification may be a volatile memory or a non-volatile memory, or may include both a volatile memory and a non-volatile memory. A non-volatile memory may include: a ROM (Read-Only Memory, read-only memory), a PROM (Programmable ROM, programmable read-only memory), an EPROM (Erasable PROM, erasable programmable read-only memory), an EEPROM (Electrically EPROM, electrically erasable programmable read-only memory), or a flash memory, which is exemplary but does not constitute a limitation. A volatile memory may include a RAM (Random Access Memory, random access memory), and is used as an external cache. RAMs in many forms such as an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchlink dynamic random access memory), and a DR RAM (Direct Rambus RAM, direct rambus random access memory) may be used, which is exemplary but is not a limitative description. The memory 708 in the system and method described in this specification intends to include, but is not limited to, these memories and any other memory of a suitable type.

In an actual application, the receiver 702 may be further coupled to a rate matching device 710, and they may be basically similar to the rate matching apparatus 205 in FIG. 2. In addition, the access terminal 700 may include a polar code encoder 712, which is basically similar to the polar code encoder 204 in FIG. 2. The rate matching device 710 may be configured to divide a first polar code output by the polar code encoder 204 into an odd number part and an even number part, where the odd number part of the first polar code includes bits in odd number locations in the first polar code, and the even number part of the first polar code includes bits in even number locations in the first polar code; and interleave the odd number part of the first polar code to obtain a first bit sequence, and interleave the even number part of the first polar code to obtain a second bit sequence, where the first bit sequence and the second bit sequence form an output sequence of rate matching.

Optionally, in an embodiment, locations of information bits in the first polar code may be in the rear half of a bit sequence of the first polar code. Specifically, the polar code encoder 712 may be further configured to determine the locations of the information bits in the first polar code according to locations of information bits in a second polar code. For example, it is determined that the locations of the information bits in the second polar code plus N/2 are the locations of the information bits in the first polar code, or in a case in which sequence numbers in the first polar code that are less than or equal to N/2 include sequence numbers oft information bits, it is determined that a location of the $(K-t)^{th}$ information bit in the second polar code plus N/2 is locations of information bits in the first polar code that have sequence numbers greater than N/2, where K is a positive integer and K=N*R, where optionally, R≤½, and t is a positive integer and 0≤t<K.

Optionally, in another embodiment, the rate matching device 710 may be further configured to perform pseudo-random interleaving on the odd number part of the first polar code to obtain the first bit sequence, and perform pseudo-random interleaving on the even number part of the first polar code to obtain the second bit sequence; or perform Quadratic interleaving on the odd number part of the first polar code to obtain the first bit sequence, and perform quadratic interleaving on the even number part of the first polar code to obtain the second bit sequence.

Specifically, the quadratic interleaving is defined as follows:

$$c(m) = \frac{km(m+1)}{2}(\bmod N),$$

and a mapping function is c(m)a c(m+1)(mod N), where m is a positive integer and 0≤m<N, k is an odd number, and mod indicates a modulo operation.

Optionally, in another embodiment, the first bit sequence obtained by the rate matching device 710 by using interleaving may be the front half of the output sequence of rate matching, and the second bit sequence may be the rear half of the output sequence of rate matching; certainly, the second bit sequence obtained by the rate matching device 710 by using interleaving may be the front half of the output sequence of rate matching, and the first bit sequence may be the rear half of the output sequence of rate matching. It should be understood that this is not limited in this embodiment of the present invention.

By using the foregoing solution, the first polar code is divided into the odd number part and the even number part, which are separately interleaved to form the output sequence of rate matching. In this way, a sequence structure after interleaving is more random, and correlation between sequences before and after interleaving is reduced; therefore, an FER can be reduced, HARQ performance can be improved, and data transmission reliability can be ensured.

In addition, the access terminal 700 may further include a modulator 714 and a transmitter 716, where the transmitter 716 is configured to send a signal to, for example, a base station or another access terminal. Although it is shown that the polar code encoder 712, the rate matching device 710, and/or the modulator 714 are or is detached from the processor 706, it may be understood that the polar code encoder 712, the rate matching device 710, and/or the modulator 714 may be a part of the processor 706 or multiple processors (which are not shown).

Figure 8:
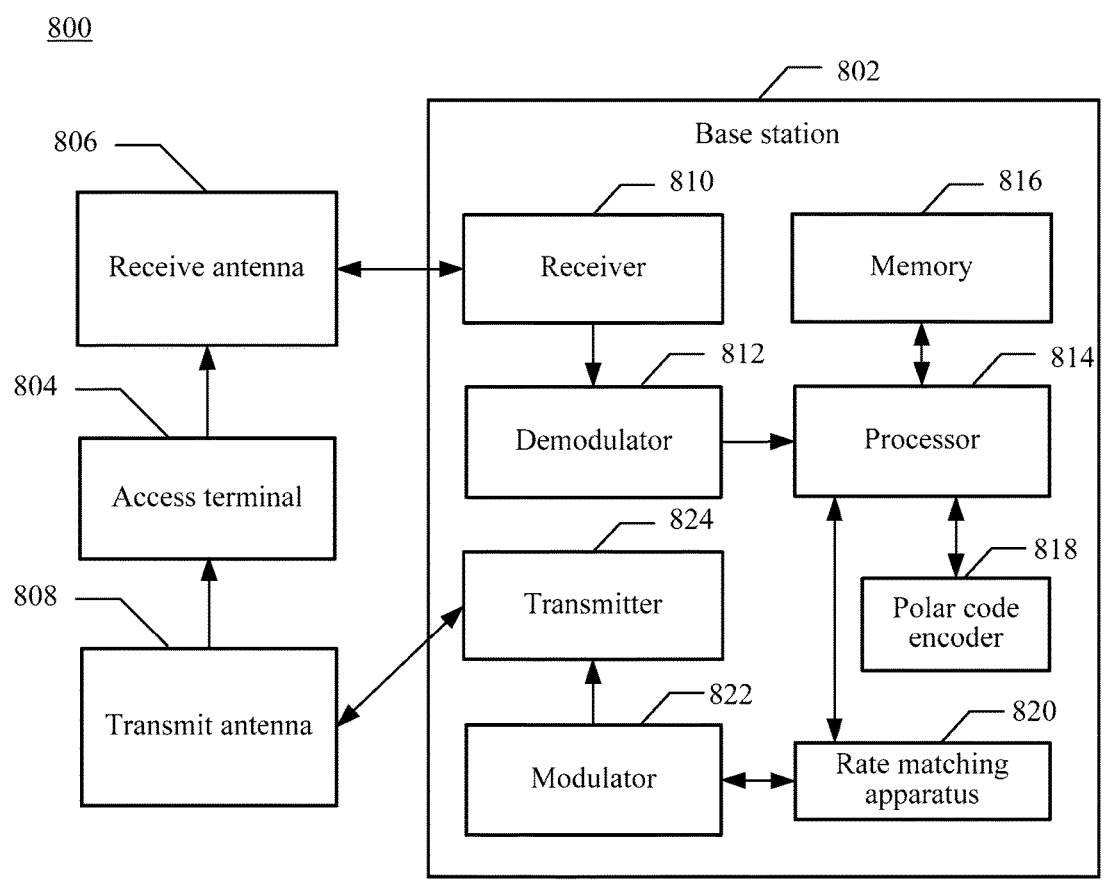
FIG. 8 is a schematic diagram of an exemplary system that facilitates execution of the foregoing polar code processing method in a wireless communications environment.

FIG. 8 is a schematic diagram of a system 800 that facilitates execution of the foregoing polar code processing method in a wireless communications environment. The system 800 includes a base station 802 (for example, an access point, an NB, or an eNB), where the base station 802 has a receiver 810 that receives signals from one or more access terminals 804 by using multiple receive antennas 806, and a transmitter 824 that transmits a signal to the one or more access terminals 804 by using a transmit antenna 808. The receiver 810 may receive information from the receive antennas 806, and is operationally associated to a demodulator 812 that demodulates the received information. A demodulated symbol is analyzed by using a processor 814 similar to the processor described in FIG. 7, the processor 814 is connected to a memory 816, and the memory 816 is configured to store data to be sent to the access terminals 804 (or a different base station (which is not shown)), or data received from the access terminals 804 (or a different base station (which is not shown)), and/or any other suitable information related to execution of various operations and functions in this specification. The processor 814 may be further coupled to a polar code encoder 818 and a rate matching apparatus 820. The rate matching apparatus 820 may be configured to divide a first polar code output by the polar code encoder 818 into an odd number part and an even number part, where the odd number part of the first polar code includes bits in odd number locations in the first polar code, and the even number part of the first polar code includes bits in even number locations in the first polar code; and interleave the odd number part of the first polar code to obtain a first bit sequence, and interleave the even number part of the first polar code to obtain a second bit sequence, where the first bit sequence and the second bit sequence form an output sequence of rate matching.

Optionally, in an embodiment, locations of information bits in the first polar code may be in the rear half of a bit sequence of the first polar code. Specifically, the polar code encoder 818 may be further configured to determine the locations of the information bits in the first polar code according to locations of information bits in a second polar code. For example, it is determined that the locations of the information bits in the second polar code plus N/2 are the locations of the information bits in the first polar code, or in a case in which sequence numbers in the first polar code that are less than or equal to N/2 include sequence numbers oft information bits, it is determined that a location of the (K-t)$^{th}$ information bit in the second polar code plus N/2 is locations of information bits in the first polar code that have sequence numbers greater than N/2, where K is a positive integer and K=N*R, where optionally, R≤½, and t is a positive integer and 0≤t<K.

Optionally, in another embodiment, the rate matching apparatus 820 may be further configured to perform pseudo-random interleaving on the odd number part of the first polar code to obtain the first bit sequence, and perform pseudo-random interleaving on the even number part of the first polar code to obtain the second bit sequence; or perform Quadratic interleaving on the odd number part of the first polar code to obtain the first bit sequence, and perform quadratic interleaving on the even number part of the first polar code to obtain the second bit sequence.

Specifically, the quadratic interleaving is defined as follows:

$$c(m) = \frac{km(m+1)}{2}(\bmod N),$$

and a mapping function is c(m)a c(m+1)(mod N), where m is a positive integer and 0≤m<N, k is an odd number, and mod indicates a modulo operation.

Optionally, in another embodiment, the first bit sequence obtained by the rate matching apparatus 820 by using interleaving may be the front half of the output sequence of rate matching, and the second bit sequence may be the rear half of the output sequence of rate matching; certainly, the second bit sequence obtained by the rate matching apparatus 820 by using interleaving may be the front half of the output sequence of rate matching, and the first bit sequence may be the rear half of the output sequence of rate matching. It should be understood that this is not limited in this embodiment of the present invention.

By using the foregoing solution, the first polar code is divided into the odd number part and the even number part, which are separately interleaved to form the output sequence of rate matching. In this way, a sequence structure after interleaving is more random, and correlation between sequences before and after interleaving is reduced; therefore, an FER can be reduced, HARQ performance can be improved, and data transmission reliability can be ensured.

In addition, in the system 800, a modulator 822 may multiplex a frame, so that the transmitter 824 sends information to the access terminals 804 by using the antenna 808.

Although it is shown that the polar code encoder 818, the rate matching apparatus 820, and/or the modulator 822 are or is detached from the processor 814, it may be understood that the polar code encoder 818, the rate matching apparatus 820, and/or the modulator 822 may be a part of the processor 814 or multiple processors (which are not shown).

It may be understood that the embodiments described in this specification may be implemented by hardware, software, firmware, middleware, microcode, or a combination thereof. For hardware implementation, a processing unit may be implemented in one or more ASICs (Application Specific Integrated Circuits, application specific integrated circuit), DSPs (Digital Signal Processing, digital signal processor), DSPDs (DSP Device, digital signal processing device), PLDs (Programmable Logic Device, programmable logic device), FPGAs (Field-Programmable Gate Array, field-programmable gate array), processors, controllers, micro-controllers, microprocessors, other electronic units for performing the functions in this application, or a combination thereof.

When the embodiments are implemented in software, firmware, middleware, microcode, program code, or a code segment, they may be stored in, for example, a machine-readable medium of a storage component. A code segment may indicate a process, a function, a subprogram, a program, a routine, a subroutine, a module, a software group, a type, or any combination of an instruction, a data structure, and a program statement. A code segment may be coupled to another code segment or a hardware circuit by transmitting and/or receiving information, data, an independent variable, a parameter, or content in a memory. Information, an independent variable, a parameter, data, or the like may be transferred, forwarded, or sent in any suitable manner including memory sharing, message transmission, token transmission, or network transmission.

For software implementation, the technologies in this specification may be implemented by executing the functional modules (for example, a process and a function) in this specification. Software code may be stored in a storage unit and executed by a processor. The storage unit may be implemented inside a processor or outside a processor, and in the latter case, the storage unit may be coupled to the processor by means of communication by using various means known in the art.

Figure 9:
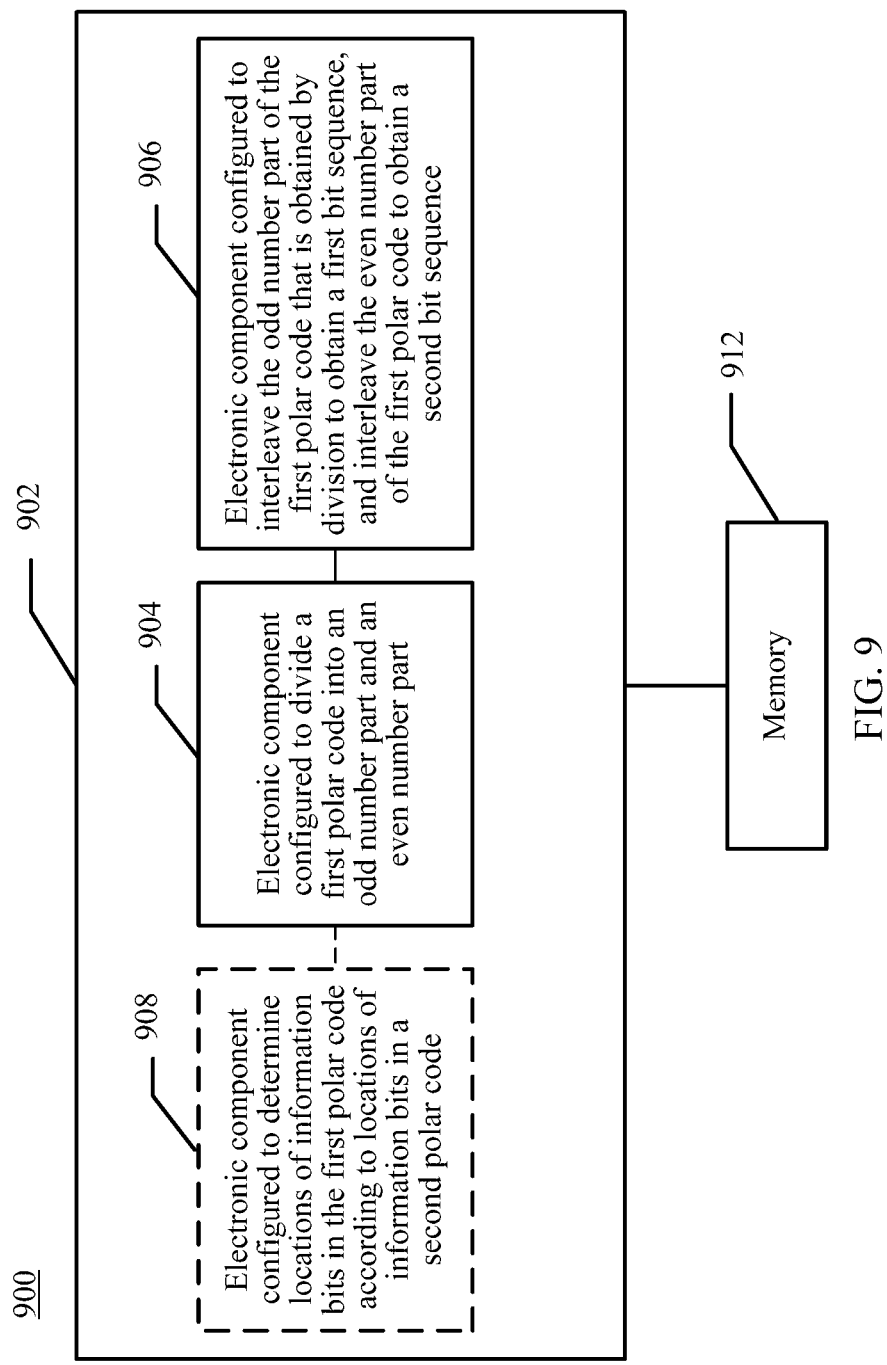
FIG. 9 is a schematic diagram of an exemplary system that can use a polar code processing method in a wireless communications environment.

Referring to FIG. 9, FIG. 9 shows a system 900 that can use a polar code processing method in a wireless communications environment. For example, the system 900 may at least partially reside within a base station. According to another example, the system 900 may at least partially reside within an access terminal. It should be understood that the system 900 may be indicated as including a functional block, which may indicate a functional block of a function implemented by a processor, software, or a combination thereof (for example, firmware). The system 900 includes a logical group 902 having electronic components that jointly perform an operation. For example, the logical group 902 may include an electronic component 904 configured to divide a first polar code into an odd number part and an even number part, and an electronic component 906 configured to interleave the odd number part of the first polar code to obtain a first bit sequence, and interleave the even number part of the first polar code to obtain a second bit sequence. The logical group 902 may further include an electronic component 908 configured to determine locations of information bits in the first polar code according to locations of information bits in a second polar code.

By using the foregoing solution, the first polar code is divided into the odd number part and the even number part, which are separately interleaved to form the output sequence of rate matching. In this way, a sequence structure after interleaving is more random, and correlation between sequences before and after interleaving is reduced. Therefore, an FER can be reduced, HARQ performance can be improved, and data transmission reliability can be ensured.

In addition, the system 900 may include a memory 912, and the memory 912 saves instructions used to execute functions related to the electronic component 904, the electronic component 906, and the electronic component 908. Although it is shown that the electronic component 904, the electronic component 906, and the electronic component 908 are outside the memory 912, it may be understood that one or more of the electronic component 904, the electronic component 906, and the electronic component 908 may exist inside the memory 912.

Examples of one or more embodiments are described above. Certainly, it is impossible to describe all possible combinations of components or methods to describe the embodiments, but a person of ordinary skill in the art should know that the embodiments may be further combined and modified. Therefore, the embodiments described in this application are intended to include all changes, modifications, and variations falling within the spirit and the protection scope of the appended claims. In addition, for the term "include" used in the specification or the claims, meaning included in the term is similar to that included in the term "comprise", and is like that of the term "comprise" explained as a connecting term in the claims.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code processing method, comprising:
encoding, by a polar code encoder, data to be transmitted to obtain a first polar code, wherein the first polar code comprises: bits in even number locations in the first polar code and bits in odd number locations in the first polar code;
interleaving, by the polar code encoder, the first polar code to obtain an output sequence of rate matching, wherein the output sequence of rate matching comprises: a first bit sequence and a second bit sequence, wherein the first bit sequence is obtained by interleaving an odd number part of the first polar code, wherein the second bit sequence is obtained by interleaving an even number part of the first polar code; and
outputting, by the polar code encoder, the output sequence of rate matching.

2. The method according to claim 1, wherein the first polar code has a length of N and a bit rate of R, wherein R>0, N=2$^n$, and n is an integer that is greater than or equal to 0; and a set of information bits of the first polar code is obtained according to a set of information bits of a second polar code that has a length of N/2 and a bit rate of 2R; and the method further comprises:
determining locations of the information bits in the first polar code according to locations of the information bits in the second polar code.

3. The method according to claim 2, wherein the determining locations of the information bits in the first polar code according to locations of the information bits in the second polar code comprises:
determining that the locations of the information bits in the second polar code plus N/2 are the locations of the information bits in the first polar code.

4. The method according to claim 2, wherein a length of the first polar code that is less than or equal to N/2 comprises t information bits, and the determining locations of the information bits in the first polar code according to locations of the information bits in the second polar code comprises:
determining that locations of (K-t) information bits in the second polar code plus N/2 are locations of information bits in a length of the first polar code greater than N/2, wherein K is a positive integer and K=N*R, and t is a positive integer and 0≤t<K.

5. The method according to claim 1, wherein the interleaving the first polar code to obtain an output sequence of rate matching comprises:
performing pseudo-random interleaving on the odd number part of the first polar code to obtain the first bit sequence, and performing pseudo-random interleaving on the even number part of the first polar code to obtain the second bit sequence; or
performing quadratic interleaving on the odd number part of the first polar code to obtain the first bit sequence, and performing quadratic interleaving on the even number part of the first polar code to obtain the second bit sequence.

6. The method according to claim 5, wherein the quadratic interleaving is defined as follows:

$$c(m) = \frac{km(m+1)}{2} (\mathrm{mod} N),$$

and
a mapping function is c(m) a c(m+1)(modN), wherein m is a positive integer and 0≤m<N, k is an odd number, and mod indicates a modulo operation.

7. The method according to claim 1, wherein the first bit sequence is the front half of the output sequence of rate matching, and the second bit sequence is the rear half of the output sequence of rate matching; or the second bit sequence is the front half of the output sequence of rate matching, and the first bit sequence is the rear half of the output sequence of rate matching.

8. A polar code processing device, comprising:
a division unit, configured to encode data to be transmitted to obtain a first polar code, wherein the first polar code comprises: bits in odd number locations in the first polar code, and bits in even number locations in the first polar code; and
an interleaving unit, configured to interleave the first polar code to obtain an output sequence of rate matching, wherein the output sequence of rate matching comprises: a first bit sequence and a second bit sequence, wherein the first bit sequence is obtained by interleaving an odd number part of the first polar code, and wherein the second bit sequence is obtained by interleaving a even number part of the first polar code.

9. The device according to claim 8, wherein the first polar code has a length of N and a bit rate of R, wherein R>0, N=2$^n$, and n is an integer that is greater than or equal to 0; and a set of information bits of the first polar code is obtained according to a set of information bits of a second polar code that has a length of N/2 and a bit rate of 2R; and the device further comprises a determining unit, wherein
the determining unit is configured to determine locations of the information bits in the first polar code according to locations of the information bits in the second polar code.

10. The device according to claim 9, wherein
the determining unit is specifically configured to determine that the locations of the information bits in the second polar code plus N/2 are the locations of the information bits in the first polar code.

11. The device according to claim 9, wherein a length of the first polar code that is less than or equal to N/2 comprises t information bits, and
the determining unit is configured to determine that locations of (K-t) information bits in the second polar code plus N/2 are locations of information bits in a length of the first polar code greater than N/2, wherein K is a positive integer and K=N*R, and t is a positive integer and 0≤t<K.

12. The device according to claim 8, wherein the interleaving unit is specifically configured to perform pseudo-random interleaving on the odd number part of the first polar code to obtain the first bit sequence, and perform pseudo-random interleaving on the even number part of the first polar code to obtain the second bit sequence; or
the interleaving unit is specifically configured to perform quadratic Quadratic interleaving on the odd number part of the first polar code to obtain the first bit sequence, and perform quadratic interleaving on the even number part of the first polar code to obtain the second bit sequence.

13. The device according to claim 12, wherein the quadratic interleaving is defined as follows:

$$c(m) = \frac{km(m+1)}{2} (\mathrm{mod} N),$$

and
a mapping function is c(m) a c(m+1)(mod N), wherein m is a positive integer and 0≤m<N, k is an odd number, and mod indicates a modulo operation.

14. The device according to claim 8, wherein the first bit sequence obtained by the interleaving unit is the front half of the output sequence of rate matching, and the second bit sequence is the rear half of the output sequence of rate matching; or the second bit sequence obtained by the interleaving unit is the front half of the output sequence of rate matching, and the first bit sequence is the rear half of the output sequence of rate matching.

15. A wireless communications apparatus, comprising a processor and a memory, wherein the memory stores instructions that when executed by the processor, configure the processor for performing the following operations:
encoding, by a polar code encoder, data to be transmitted to obtain a first polar code, wherein the first polar code comprises: bits in even number locations in the first polar code and bits in odd number locations in the first polar code; and interleaving the first polar code to obtain an output sequence of rate matching, wherein the output sequence of rate matching comprises: a first bit sequence and a second bit sequence, wherein the first bit sequence is obtained by interleaving an odd number part of the first polar code, and wherein the second bit sequence is obtained by interleaving a even number part of the first polar code.

16. The wireless communications apparatus according to claim 15, wherein the first polar code has a length of N and a bit rate of R, wherein R>0, N=$2^n$, and n is an integer that is greater than or equal to 0; and a set of information bits of the first polar code is obtained according to a set of information bits of a second polar code that has a length of N/2 and a bit rate of 2R; and the memory further stores instructions that when executed by the processor, configure the processor for performing the following operation:
determining locations of the information bits in the first polar code according to locations of the information bits in the second polar code.

17. The wireless communications apparatus according to claim 16, wherein the memory further stores instructions that when executed by the processor, configure the processor for performing the following operation:
determining that the locations of the information bits in the second polar code plus N/2 are the locations of the information bits in the first polar code.

18. The wireless communications apparatus according to claim 16, wherein a length of the first polar code that is less than or equal to N/2 comprises t information bits, and the memory further stores instructions that when executed by the processor, configure the processor for performing the following operation:
determining that locations of (K-t) information bits in the second polar code plus N/2 are locations of information bits in a length of the first polar code greater than N/2, wherein K is a positive integer and K=N*R, and t is a positive integer and 0≤t<K.

19. The wireless communications apparatus according to claim 15, wherein the memory further stores instructions that when executed by the processor, configure the processor for performing the following operation:
performing pseudo-random interleaving on the odd number part of the first polar code to obtain the first bit sequence, and performing pseudo-random interleaving on the even number part of the first polar code to obtain the second bit sequence; or
performing quadratic interleaving on the odd number part of the first polar code to obtain the first bit sequence, and performing quadratic interleaving on the even number part of the first polar code to obtain the second bit sequence.

20. The wireless communications apparatus according to claim 19, wherein the memory further stores instructions that when executed by the processor, configure the processor for performing the following operation: the first bit sequence is the front half of the output sequence of rate matching, and the second bit sequence is the rear half of the output sequence of rate matching; or the second bit sequence is the front half of the output sequence of rate matching, and the first bit sequence is the rear half of the output sequence of rate matching.

* * * * *

UNITED STATES PATENT AND TRADEMARK OFFICE
CERTIFICATE OF CORRECTION

PATENT NO.         : 10,148,289 B2
APPLICATION NO.    : 15/159484
DATED              : December 4, 2018
INVENTOR(S)        : Hui Shen et al.

Page 1 of 1

It is certified that error appears in the above-identified patent and that said Letters Patent is hereby corrected as shown below:

In the Claims

Claim 6, Column 20, Line 33 "$c(m)\ a\ c(m+1)(modN)$" should read -- $c(m) \mapsto c(m+1)(\mathrm{mod}\ N)$ --

Claim 13, Column 21, Line 36 "$c(m)\ a\ c(m+1)(mod\ N)$" should read -- $c(m) \mapsto c(m+1)(\mathrm{mod}\ N)$ --

Signed and Sealed this
Third Day of September, 2019

Andrei Iancu
*Director of the United States Patent and Trademark Office*